(12) United States Patent
Moriya (10) Patent No.: US 7,821,234 B2
(45) Date of Patent: Oct. 26, 2010

(54) ABNORMALITY DETERMINATION DEVICE OF POWER SUPPLY AND ABNORMALITY DETERMINATION METHOD THEREOF

(75) Inventor: Kouki Moriya, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 241 days.

(21) Appl. No.: 11/887,206

(22) PCT Filed: Feb. 6, 2007

(86) PCT No.: PCT/JP2007/052046

§ 371 (c)(1),
(2), (4) Date: Sep. 26, 2007

(87) PCT Pub. No.: WO2007/097190

PCT Pub. Date: Aug. 30, 2007

(65) Prior Publication Data

US 2009/0128157 A1    May 21, 2009

(30) Foreign Application Priority Data

Feb. 27, 2006    (JP)   .............................. 2006-050035

(51) Int. Cl.
     *H02J 7/00*      (2006.01)
(52) U.S. Cl. .................... 320/134; 320/164; 324/426
(58) Field of Classification Search ................ 324/426, 324/430, 433; 320/134, 136, 156, 161, 164; 361/79

See application file for complete search history.

(56) References Cited

U.S. PATENT DOCUMENTS

| 6,992,487 | B1 * | 1/2006 | Steinke | 324/426 |
| 2004/0239333 | A1 * | 12/2004 | Kikuchi | 324/434 |

FOREIGN PATENT DOCUMENTS

| JP | 07-184325 | 7/1995 |
| JP | 10-253682 | 9/1998 |

OTHER PUBLICATIONS

International Search Report, 2007.

* cited by examiner

*Primary Examiner*—Edward Tso
*Assistant Examiner*—Aaron Piggush
(74) *Attorney, Agent, or Firm*—Finnegan, Henderson, Farabow, Garrett & Dunner, LLP

(57) ABSTRACT

A power supply having a battery (2) that supplies electric power to an electric load (6), a current sensor (4) that detects the current of the battery (2), and a voltage sensor (5) that detects the voltage of the battery (2) includes abnormality determination means for determining that an open failure has occurred in the battery (2) when the voltage detected by the voltage sensor (5) is larger than a first predetermined change amount and the current detected by the current sensor (4) is smaller than a second predetermined change amount, and determining, if an open failure is not found in the battery (2), that an intermediate fixed failure has occurred in the current sensor (4) when the internal resistance of the battery (2) is greater than or equal to a predetermined value.

8 Claims, 6 Drawing Sheets

| | | VOLTAGE CHANGE AMOUNT OF BATTERY | BATTERY CURRENT VALUE |
|---|---|---|---|
| 1 | BATTERY AND CURRENT SENSOR ARE IN NORMAL STATE | SMALL | LARGE |
| 2 | BATTERY IS IN NORMAL STATE AND CURRENT SENSOR HAS INTERMEDIATE FIXED FAILURE. | SMALL | FIXED VALUE |
| 3 | BATTERY HAS OPEN FAILURE AND CURRENT SENSOR IS IN NORMAL STATE | LARGE | ZERO |
| 4 | BATTERY HAS OPEN FAILURE AND CURRENT SENSOR HAS INTERMEDIATE FIXED FAILURE. | LARGE | FIXED VALUE |

| | | VOLTAGE CHANGE AMOUNT OF BATTERY | BATTERY CURRENT VALUE |
|---|---|---|---|
| 1 | BATTERY AND CURRENT SENSOR ARE IN NORMAL STATE | SMALL | LARGE |
| 2 | BATTERY IS IN NORMAL STATE AND CURRENT SENSOR HAS INTERMEDIATE FIXED FAILURE. | SMALL | FIXED VALUE |
| 3 | BATTERY HAS OPEN FAILURE AND CURRENT SENSOR IS IN NORMAL STATE | LARGE | ZERO |
| 4 | BATTERY HAS OPEN FAILURE AND CURRENT SENSOR HAS INTERMEDIATE FIXED FAILURE. | LARGE | FIXED VALUE |

ABNORMALITY DETERMINATION DEVICE OF POWER SUPPLY AND ABNORMALITY DETERMINATION METHOD THEREOF

TECHNICAL FIELD

The present invention relates to an abnormality determination device of a power supply provided with a battery and a current sensor that detects the current of the battery and to an abnormality determination method thereof.

BACKGROUND ART

A known failure determination device for a current sensor is of a type which determines a failure of the current sensor that detects the current of a battery supplying electric power to an electric load (see, e.g., Patent Document 1). This failure determination device focuses on the fact that, due to the internal resistance of the battery, the battery voltage decreases as the battery current increases. In other words, the device detects the change amount of the battery current when the battery voltage changes by a reference change amount and determines, if the change amount of the battery current is a reference value or lower, that an intermediate fixed failure has occurred in the current sensor because the battery current, which should have changed, has not changed due to a failure of the battery sensor.

Patent Document 1: JP-A-10-253682

DISCLOSURE OF INVENTION

Problems to be Solved by the Invention

In the above-described related art, however, if an open failure such as disconnection of a battery terminal occurs in the battery even if the current sensor is in a normal state, the effect of stabilization of the voltage by the battery would wear off, which might cause the battery voltage (namely, the voltage applied to the electric load) to exceed the reference change amount due to a change in power consumption of the electric load, or the like. Moreover, neither charging nor discharging the battery is performed, which might cause the change amount of the battery current to be the reference value or lower. Accordingly, the above-described related art has the possibility of erroneously determining that an intermediate fixed failure has occurred in the current sensor despite the fact that an open failure has occurred in the battery.

In view of this, the present invention has an object of providing an abnormality determination device of a power supply and an abnormality determination method thereof, capable of determining abnormality while discriminating between an open failure in a battery and an intermediate fixed failure in a current sensor.

Means for Solving the Problems

In order to attain the above object, there is provided, as a first aspect of the present invention, an abnormality determination device of a power supply having a battery that supplies electric power to an electric load, a current sensor that detects a current of the battery, and a voltage sensor that detects a voltage of the battery, the device comprising determination means for determining that an open failure has occurred in the battery when the voltage detected by the voltage sensor is larger than a first predetermined change amount and the current detected by the current sensor is smaller than a second predetermined change amount, and for determining that an intermediate fixed failure has occurred in the current sensor when the voltage detected by the voltage sensor is less than or equal to the first change amount and the current detected by the current sensor is smaller than the second change amount.

Furthermore, there is provided, as a second aspect of the present invention, the abnormality determination device of the power supply according to the first aspect of the present invention, wherein the battery is capable of being charged with a generator.

In order to attain the above object, furthermore, there is provided, as a third aspect of the present invention, an abnormality determination device of a power supply having a battery that supplies electric power to an electric load, a current sensor that detects a current of the battery, and a voltage sensor that detects a voltage of the battery, the device comprising determination means for determining that an open failure has occurred in the battery when the voltage detected by the voltage sensor is larger than a first predetermined change amount and the current detected by the current sensor is smaller than a second predetermined change amount, and for determining that an intermediate fixed failure has occurred in the current sensor when the battery is in a normal state and an internal resistance of the battery is greater than or equal to a predetermined value.

Furthermore, there is provided, as a fourth aspect of the present invention, the abnormality determination device of the power supply according to the third aspect of the present invention, wherein the internal resistance is calculated based on a regression curve obtained by using the current and the voltage of the battery.

Furthermore, there is provided, as a fifth aspect of the present invention, the abnormality determination device of the power supply according to the third aspect of the present invention, wherein the battery is capable of being charged with a generator.

In order to attain the above object, furthermore, there is provided as a sixth aspect of the present invention, an abnormality determination method of a power supply having a battery that supplies electric power to an electric load, a current sensor that detects a current of the battery, and a voltage sensor that detects a voltage of the battery, the method comprising: determining that an open failure has occurred in the battery when the voltage detected by the voltage sensor is larger than a first predetermined change amount and the current detected by the current sensor is smaller than a second predetermined change amount; and determining, if an open failure is not found in the battery, that an intermediate fixed failure has occurred in the current sensor when an internal resistance of the battery is greater than or equal to a predetermined value.

Furthermore, there is provided as a seventh aspect of the present invention, the abnormality determination method of the power supply according to the sixth aspect of the present invention, comprising: calculating the internal resistance based on a regression curve obtained by using the current and the voltage of the battery.

Furthermore, there is provided as an eighth aspect of the present invention, the abnormality determination method of the power supply according to the sixth aspect of the present invention, wherein the battery is capable of being charged with a generator.

Advantage of the Invention

According to the present invention, it is possible to determine abnormality while discriminating between an open failure in the battery and an intermediate fixed failure in the current sensor.

EXPLANATION FOR REFERENCE NUMBER 1 generator
2 battery
2a, 2b battery terminal
4 current sensor
5 voltage sensor
6 electric loads
10 ECU
14 power supply line
15 GND line

BEST MODE FOR CARRYING OUT THE INVENTION

Figure 1:
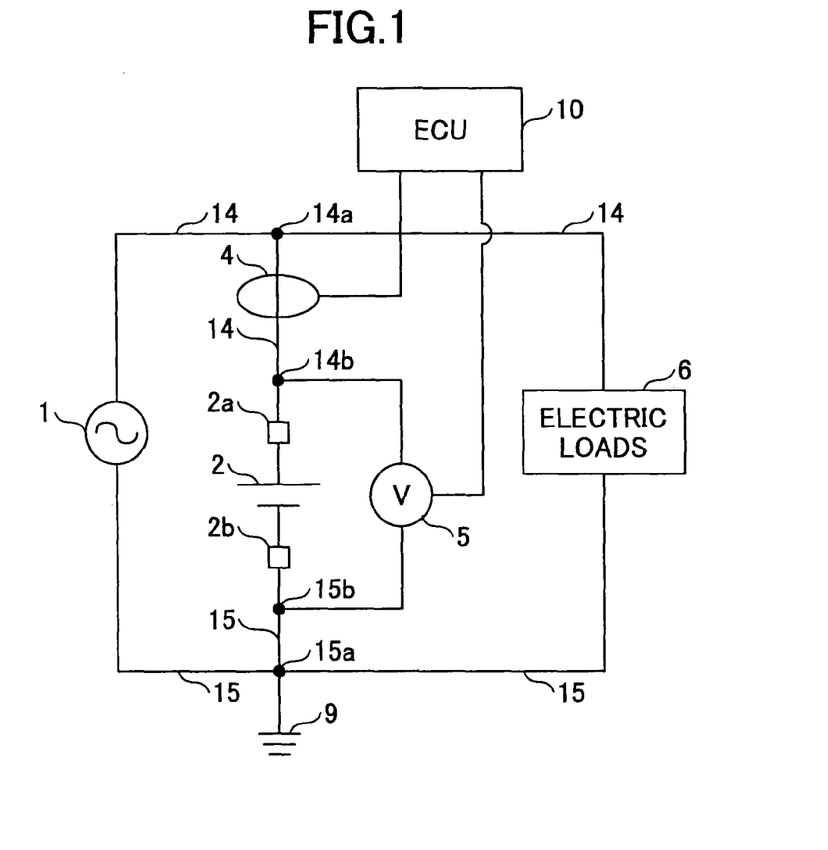
FIG. 1 is a block diagram showing an embodiment of an abnormality determination device of a power supply of the present invention.

Next, a description is made about the best mode for carrying out the present invention with reference to the drawings. FIG. 1 is a block diagram showing an embodiment of an abnormality determination device of a power supply of the present invention. The abnormality determination device of the power supply of the present embodiment is mounted on a vehicle. The vehicle has a variety of electric loads 6 mounted thereon. Examples of the electric loads 6 mounted on the vehicle include, for example, an electric power steering (EPS) apparatus that generates an assisting force depending on a steering state to assist the driver in steering, an active stabilizer system that adjusts the roll angle of the vehicle for posture control, an engine control unit, a brake operating unit, an air conditioner, a rear defogger, a rear wiper, a mirror heater, a seat heater, an audio system, a lamp, a cigarette socket, a variety of ECUs (Electronic Control Units), and a solenoid valve. Note that these electric loads are given just for exemplification purposes, not for limiting the types of loads.

The power source for these electric loads 6 is a generator 1 and a battery 2. The generator 1 and the battery 2 supply electric power to the electric loads 6 via a power supply line 14. If the electric loads 6 are of a type (for example, a resistance load such as a lamp and a relay) that does not include electronic circuits, such as a series power supply circuit and a switching power supply circuit, the electric power supplied through the power supply line 14 flows to the resistance portion of the electric loads 6 as it is. If the electric loads 6 are electric components (for example, an ECU) that include the power supply circuits as described above, the electric power supplied through the power supply line 14 flows to respective parts of the electric loads 6 via the power supply circuits included in the electric components. The generator 1, a positive terminal 2a of the battery 2, and the electric loads 6 are connected to one another via the power supply line 14. Furthermore, the generator 1 and the battery 2 are grounded to a vehicle body 9, and the electric loads 6 are directly grounded to the vehicle body 9 or connected to a negative terminal 2b of the battery 2 via a GND line 15.

The generator 1 generates electric power by the output of an engine for running a vehicle. The electric power generated in the generator 1 causes the electric loads 6 to operate and the battery 2 to be charged. A specific example of the generator 1 includes an alternator. Note that the generator 1 may be a motor capable of performing regenerative control because charging or the like of the battery 2 can also be made by a regenerative operation of a motor (electric motor). For example, the regeneration control of the motor connected to a driving shaft of a wheel for securing a braking force of the vehicle makes it possible to charge the battery 2 or supply electric power to the electric loads 6 via an inverter. Furthermore, the generator 1 as shown in FIG. 1 may be a DC/DC converter that converts the voltage between the battery 2 and another battery not shown. In this case, the other battery not shown corresponds to the power source for the electric loads 6 in place of the generator 1.

The battery 2 also supplies electric power to the electric loads 6 via the power supply line 14 in the same manner as the generator 1. The battery 2 supplies electric power to the electric loads 6 when the electric power supply capacity of the generator 1 is insufficient. Furthermore, electric power may be supplied to a starter (not shown) when a power source such as an engine is started. The starter serves to start the power source such as an engine upon receiving the electric power from the battery 2. A specific example of the battery 2 includes a lead battery, a nickel hydride battery, and a lithium-ion battery. Note that the battery 2 may be formed by combining any of the lead battery, the lithium-ion battery, and the nickel hydride battery.

Furthermore, where the generator 1 is stopped, electric power can be supplied from the battery 2 to the electric loads 6. For example, the electric power required when an alternator as one form of the generator 1 is in a non-operating status can be supplied from the battery 2 to the electric loads 6.

The ECU 10 calculates the charging and discharging current value of the battery 2 based on the output value of a current sensor 4 that detects the charging and discharging currents (battery current) of the battery 2. A current detection unit included in the current sensor 4 is of a type that detects a current by a Hall element, a type that detects a current by a shunt resistance, and the like. The current sensor 4 outputs, for example, voltages (ranging from 0 through 5 V) depending on the detected current. Furthermore, the ECU 10 calculates the voltage value of the battery 2 based on the output value of a voltage sensor 5 that detects the voltage of the battery 2. As is also apparent from FIG. 1, the voltage of the battery 2 corresponds to the voltage of the power supply line 14, which is applied to the electric loads 6.

Furthermore, the ECU 10 performs feedback control for controlling the amount of electric power generated by the generator 1 based mainly on the output value of the voltage sensor 5 so that the voltage of the battery 2 is set to a predetermined constant value. Note that the ECU 10 may acquire as information an electric power generation status of the generator 1 for determining whether the generator 1 is actually generating electric power. For this purpose, the generator 1 may be provided with means for outputting to the ECU 10 an electric power generation status showing whether electric power is being generated. A specific example includes an L terminal of an alternator, which outputs a Hi signal when electric power is being generated and a Lo signal when electric power is not being generated. Furthermore, it is also possible for the ECU 10 to directly monitor the output current or the output voltage of the generator 1 to determine whether the generator 1 is actually generating electric power without having such means.

Note that the ECU 10 is composed of plural circuit elements such as a ROM for storing control programs and control data, a RAM for temporarily storing processing data of the control programs, a CPU for processing the control programs, and an input/output interface for exchanging information with the outside. Furthermore, the ECU 10 is not always limited to one control unit but may be of plural control units for taking partial charge of control.

Meanwhile, the ECU 10 determines whether an open failure has occurred in the battery 2 and an intermediate immovable failure (intermediate fixed failure) has occurred in the current sensor 4 using the output value of the current sensor 4 and the output value of the voltage sensor 5. The ECU 10 also discriminates between the failures.

The open failure in the battery 2 refers to an open failure inside the battery 2 or disconnection of the terminals 2a and 2b of the battery 2. The open failure inside the battery 2 is caused by, for example, internal mechanical breakage, penetration of corrosive substances, evaporation of electrolyte, and degradation with time. On the other hand, disconnection of the terminals of the battery 2 is caused by a poor connection between the positive terminal 2a of the battery 2 and the power supply line 14 and/or between the negative terminal 2b of the battery 2 and the GND line 15. If the open failure has occurred in the battery 2, no current flows to the battery 2, whereby no current is detected by the current sensor 4. Furthermore, if the open failure has occurred in the battery 2, the voltage of the power supply line 14 is detected by the voltage sensor 5 where the battery 2 is not connected.

On the other hand, an intermediate fixed failure in the current sensor 4 as is generally known refers to a failure in which the output value of the current sensor 4 is fixed at a certain value between the upper limit and the lower limit regardless of the value of the flowing current. The fixation of the output value of the current sensor 4 means not only one fixed value but also the change of the output value within certain small predetermined ranges. An intermediate fixed failure occurs when a current detection unit or the like included in the current sensor 4 is broken down or when the wiring connecting the ECU 10 and the current sensor 4 to each other is half short-circuited.

In FIG. 1, if an open failure has occurred in the battery 2, the effect of stabilization of the voltage by the battery 2 will wear off, so that the voltage change amount of the power supply line 14 gets extremely larger than that before the open failure occurred in the battery 2. The voltage of the power supply line 14 is changed because power consumption of the electric loads 6 changes every moment depending on the operating status of the electric loads 6. Accordingly, even if the ECU 10 controls the amount of electric power in the generator 1 based on the output value of the voltage sensor 5 so that the voltage (the voltage of the battery 2) of the power supply line 14 becomes constant, the change in voltage of the power supply line 14 cannot be under control (voltage cannot be maintained at a predetermined constant one) because the output value itself of the voltage sensor 5 changes too much. Furthermore, if the open failure has occurred in the battery 2, it is not possible for the battery 2 to charge and discharge, thereby causing the battery current value detected by the current sensor 4 to be fixed at near zero.

Figure 6:
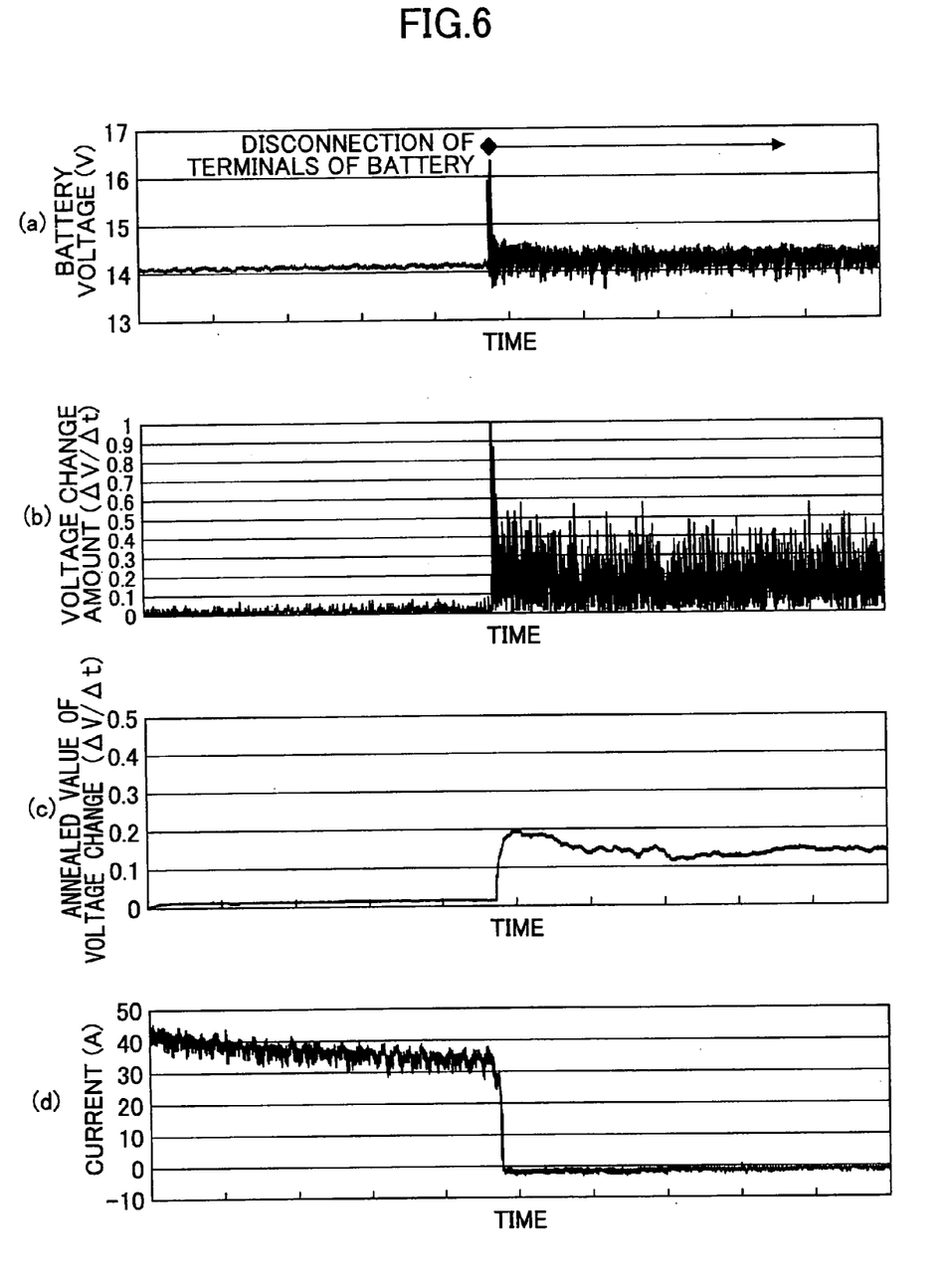
FIG. 6 is a waveform diagram showing the transition of the voltage and the current of the battery 2 before and after an open failure (disconnection of the terminals) occurs in the battery 2.

FIG. 6 is a waveform diagram showing the transition of the voltage and the current of the battery 2 before and after an open failure (disconnection of the terminals) has occurred in the battery 2. FIGS. 6-($a$) through 6-($d$) are waveforms generated at the same timing, representing one second per scale in the axis of abscissas. Note that the waveforms generated if an open failure has occurred inside the battery 2 are the same as that of FIG. 6.

FIG. 6-($a$) is a diagram showing the transition of the output value of the voltage sensor 5. Before disconnection of the terminals of the battery 2, the ECU 10 controls the amount of electric power generated by the generator 1 so that the voltage of the battery 2 is controlled to be constant at approximately 14 V. If disconnection of the terminals of the battery 2 occurs, however, the voltage temporarily rises up to approximately 16.5 V at disconnection of the terminals and then the change in voltage larger than that before disconnection of the terminals is caused to continue although the ECU 10 attempts to control the voltage constant.

FIG. 6-($b$) is a diagram showing the transition of the change amount of the output value of the voltage sensor 5 as shown in FIG. 6-($a$). The voltage change amount $\Delta V$ before disconnection of the terminals of the battery 2 varies at an amount less than 0.1 V, while that after disconnection of the terminals of the battery 2 increases to an amount approximately between 0.3 and 0.5 V. Note that the voltage change amount $\Delta V$ refers to a change amount of the voltage per micro unit time.

FIG. 6-($c$) is a diagram showing an annealed value of the voltage change amount $\Delta V$ of the battery 2 as shown in FIG. 6-($b$). The ECU 10 causes the output value of the voltage sensor 5 as shown in FIG. 6-($a$) to pass through a low-pass filter or the like and then calculates the annealed value $\Delta Vsm$ (namely, the value as shown in FIG. 6-($c$)) of the voltage change amount $\Delta V$ as shown in FIG. 6-($b$).

FIG. 6-($d$) is a diagram showing the transition of the output value of the current sensor 4. It shows that a current between 30 and 40 A flows from the battery 2 before disconnection of the terminals of the battery 2. If disconnection of the terminals occurs in the battery 2, however, it is not possible for the battery 2 to be charged and discharged, thereby causing the charging and discharging current value (battery current) detected by the current sensor 4 to be almost zero.

As described above, if an open failure has occurred in the battery 2, there occurs a remarkable change in the voltage change amount of the battery 2 detected by the voltage sensor 5 and the current value detected by the current sensor 4. In accordance with the changes, the ECU 10 determines that an open failure has occurred in the battery 2 and an intermediate fixed failure has occurred in the current sensor 4.

Figure 5:
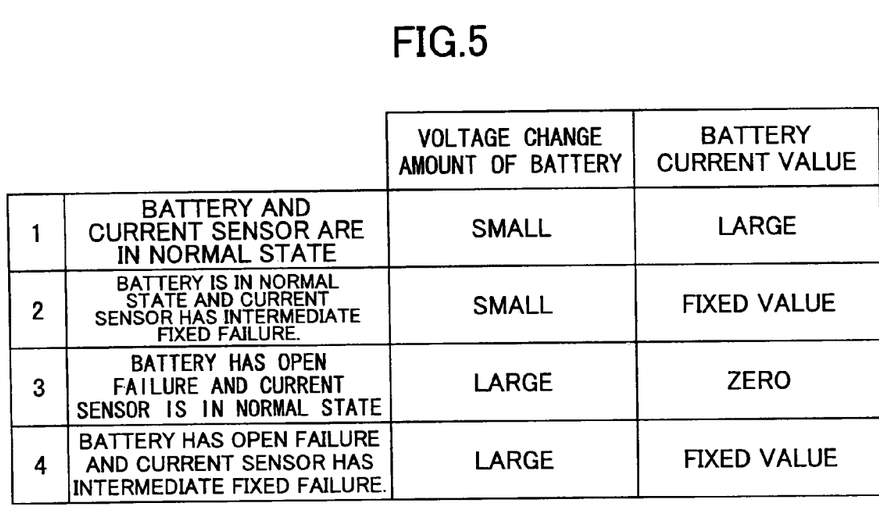
FIG. 5 is a table summarizing the relationship between the voltage change amount of the battery 2 detected by the voltage sensor 5 and the battery current value detected by the current sensor 4 when an open failure has occurred in the battery 2 and/or an intermediate fixed failure has occurred in the current sensor 4.

FIG. 5 is a table summarizing the relationship between the voltage change amount of the battery 2 detected by the voltage sensor 5 and the battery current value detected by the current sensor 4 when an open failure has occurred in the battery 2 and/or an intermediate fixed failure has occurred in the current sensor 4. As shown in FIG. 5, four combinations can be considered. (1) If both of the battery 2 and the current sensor 4 are in a normal state, the voltage change amount of the battery is detected small as shown in FIG. 6-(b) and the battery current value is detected large as shown in FIG. 6-(d). (2) If the battery 2 is in a normal state and the current sensor 4 has an intermediate fixed failure, the voltage change amount of the battery is detected small as shown in FIG. 6-(b) and the battery current is detected at a certain fixed value although it varies depending on the degree of the intermediate fixed failure. (3) If the battery 2 has an open failure and the current sensor 4 is in a normal state, the voltage change amount of the battery is detected large as shown in FIG. 6-(b) and the battery current is detected near zero as shown in FIG. 6-(d). (4) If the battery 2 has an open failure and the current sensor 4 has an intermediate fixed failure, the voltage change amount of the battery is detected large as shown in FIG. 6-(b) and the battery current is detected at a certain fixed value although it varies depending on the degree of the intermediate fixed failure.

Accordingly, if the voltage change amount of the battery is detected large and the battery current is detected at a fixed value (the change amount of the battery current is detected small), it can be recognized that at least an open failure has occurred in the battery 2. Furthermore, if the voltage change amount of the battery is detected small and the battery current is detected at a fixed value (the change amount of the battery current is detected small), it can be recognized that an open failure has occurred in the current sensor 4.

Figure 2:
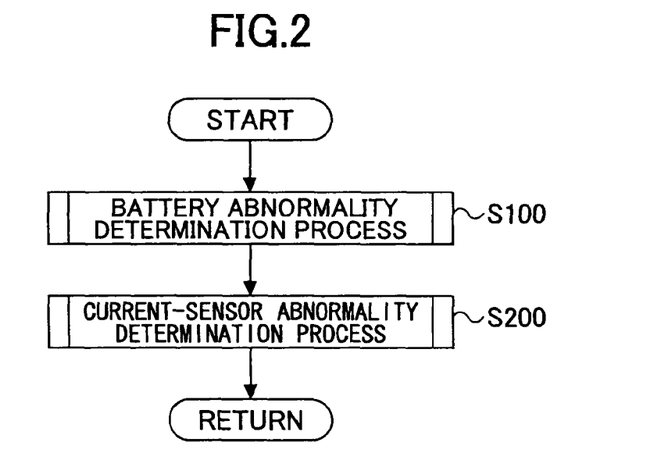
FIG. 2 is an example of an overall flow of an abnormality determination process of the abnormality determination device of the power supply of the present embodiment.

A description is now made about the operations flow of the abnormality determination device of the power supply of the present embodiment. FIG. 2 is an example of an overall flow of an abnormality determination process of the abnormality determination device of the power supply of the present embodiment. The ECU 10 executes processing for determining whether an open failure has occurred in the battery 2 (step 100) and then executes processing for determining whether an intermediate fixed failure has occurred in the current sensor 4 (step 200). This flow is repeated at a predetermined cycle, in a continuous fashion, or in a random manner. A detailed description of each step in FIG. 2 is given below.

Figure 3:
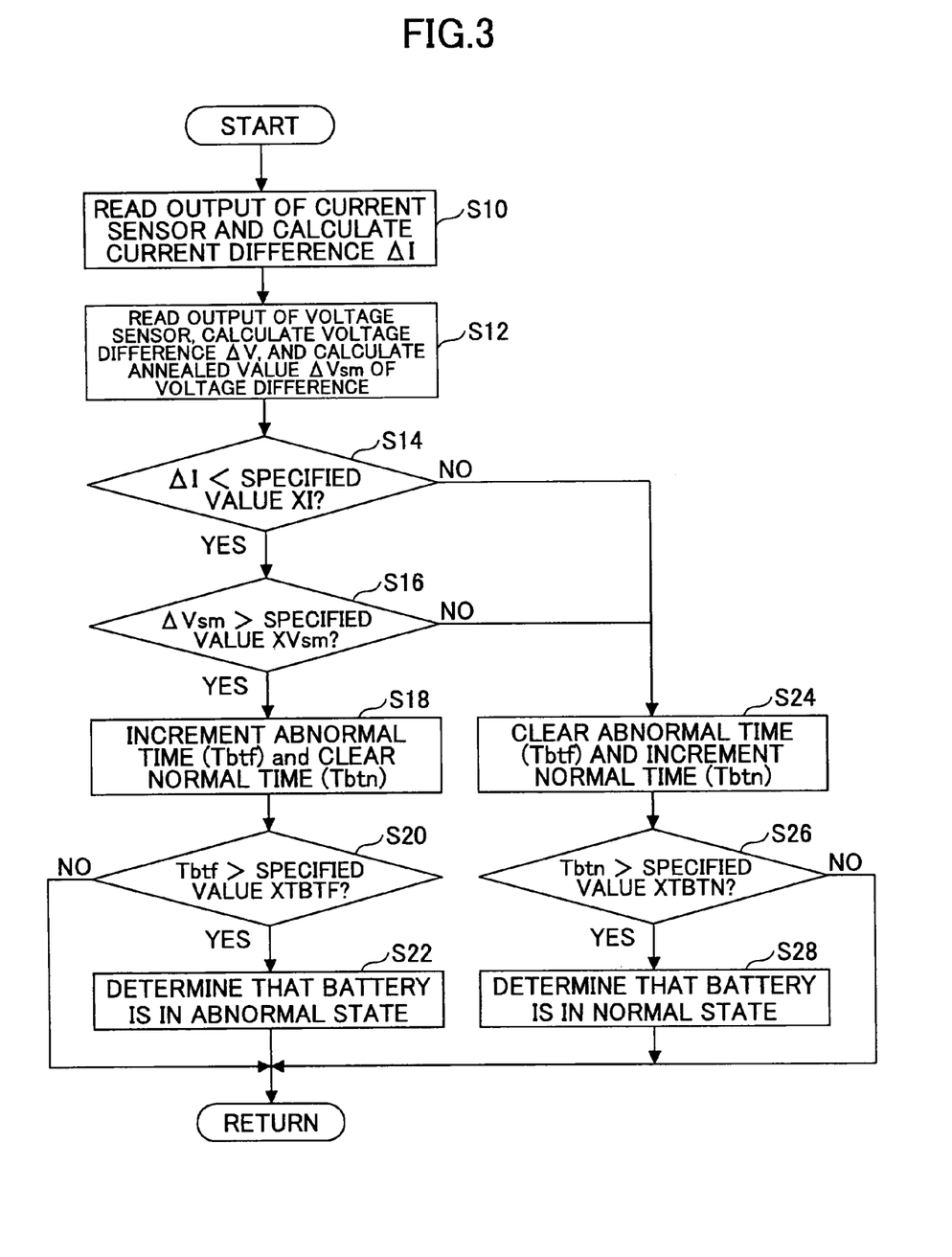
FIG. 3 is an example of a flow of the determination process for an open failure in the battery 2.

FIG. 3 is an example of a flow of the determination process for an open failure in the battery 2. When executing step 100 of the flow in FIG. 2, the ECU 10 executes processing in accordance with the flow in FIG. 3.

The ECU 10 calculates a current difference $\Delta I$ based on the result obtained by reading the output value of the current sensor 4 (step 10). The current difference $\Delta I$ calculated at this time is the difference between the reading value in the previous step 10 and that in the present step 10. Note that the current difference $\Delta I$ may be an average change amount of the reading value in any predetermined time (for example, two seconds) while the generator 1 is in operation for generating electric power.

Furthermore, the ECU 10 calculates a voltage difference $\Delta V$ by reading the output value of the voltage sensor 5-(step 12). The voltage difference $\Delta V$ calculated at this time is the annealed value $\Delta Vsm$ of the voltage change amount $\Delta V$ as shown in FIG. 6-(c). The ECU 10 determines whether the current difference $\Delta I$ is smaller than the specified value XI (step 14) and determines whether the annealed value $\Delta Vsm$ of the voltage difference is larger than the specified value XVsm (step 16).

If the current difference $\Delta I$ is smaller than the specified value XI and the voltage difference $\Delta Vsm$ is larger than the specified value XVsm, the ECU 10 increments (Tbtf=Tbtf+1) the abnormal time Tbtf and clears (Tbtn=0) the normal time Tbtn (step 18). The abnormal time Tbtf and the normal time Tbtn refer to internal variables of the program of the ECU 10. Then, it is determined whether the abnormal time Tbtf is larger than the specified value XTBTF (for example, three seconds) (step 20). The specified value XTBTF refers to a threshold value that sets a time until it is determined that an open failure has occurred in the battery 2. If the abnormal time Tbtf is larger than the specified value XTBTF (step 20; Yes), it is determined that an open failure has occurred in the battery 2 because the voltage change amount of the battery is large and the battery current is set to a fixed value (the change amount of the battery current is small). If the abnormal time Tbtf is not larger than the specified value XTBTF (step 20; No), the determination of an open failure in the battery 2 is not made.

If the current difference $\Delta I$ is not smaller than the specified value XI or if the voltage difference $\Delta Vsm$ is not larger than the specified value XVsm, on the other hand, the ECU 10 clears (Tbtf=0) the abnormal time Tbtf and increments (Tbtn=Tbtn+1) the normal time Tbtn (step 24). Then, it is determined whether the normal time Tbtn is larger than the specified value XTBTN (for example, three seconds) (step 26). The specified value XTBTN refers to a threshold value that sets a time until it is determined that the battery 2 is in a normal state. If the normal time Tbtn is larger than the specified value XTBTN (step 26; Yes), it is determined that the battery 2 is in a normal state because the battery current is not set to a fixed value but the change amount thereof is large, or because the battery current is set to a fixed value but the change amount of the battery voltage is small (step 28). If the normal time Tbtn is not larger than the specified value XTBTN (step 28; No), the determination whether the battery 2 is in a normal state is not made.

When the flow as shown in FIG. 3 is finished, the process of step 100 of the flow in FIG. 2 is finished, and then the process advances to the determination process for an intermediate fixed failure in the current sensor 4 in step 200. Alternatively, the flow as shown in FIG. 3 is repeated until it is determined that an open failure has occurred in the battery 2 in step 22 or the battery 2 is in a normal state in step 28. When it is determined that an open failure has occurred in the battery 2 or the battery is in a normal state, the process of step 100 of the flow in FIG. 2 is finished and then the process advances to the determination process for an intermediate fixed failure in the current sensor 4 in step 200.

Figure 4:
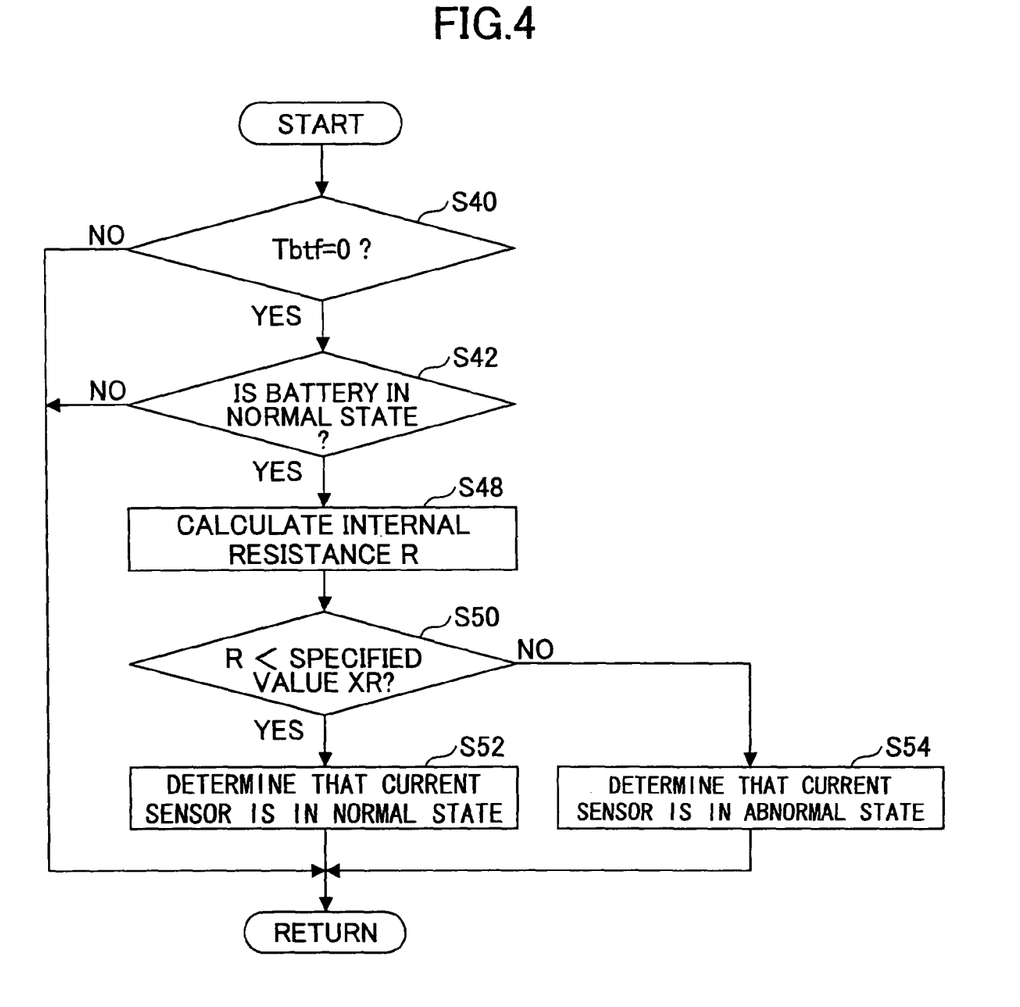
FIG. 4 is an example of a flow of the determination process for an intermediate fixed failure in the current sensor 4.

FIG. 4 is an example of a flow of the determination process for an intermediate fixed failure in the current sensor 4. When executing step 200 of the flow in FIG. 2, the ECU 10 executes processing in accordance with the flow in FIG. 4.

The ECU 10 refers to the above-described abnormal time Tbtf and confirms whether the abnormal time Tbtf is zero (step 40). If the abnormal time Tbtf is not zero, this flow is finished. If the abnormal time Tbtf is zero, it is confirmed whether the battery 2 is in a normal state, i.e., it is confirmed whether the battery 2 has been determined to be in a normal state in step 28 of FIG. 3 (step 42). More specifically, the process advances to step 48 after it has been confirmed that the battery 2 is in a normal state (no open failure has occurred in the battery 2) in steps 40 and 42.

Figure 7:
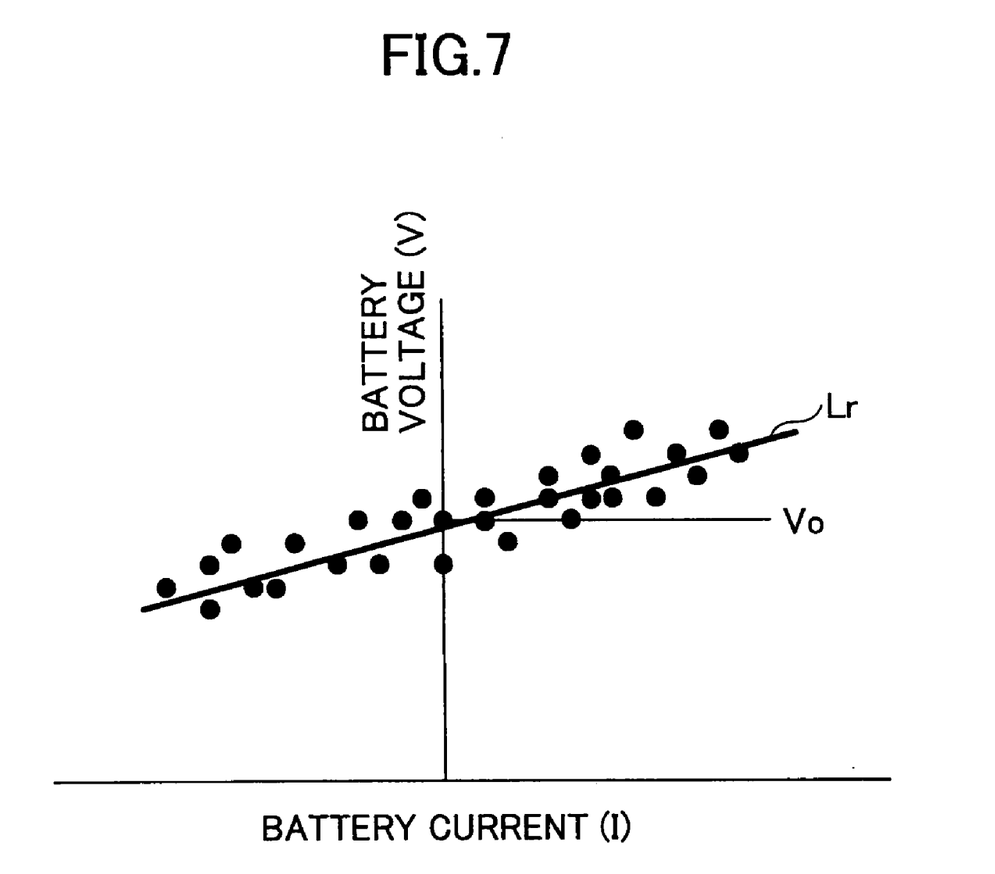
FIG. 7 is a diagram for illustrating the calculation of the internal resistance R.

If it is determined that the battery 2 is in a normal state, the ECU 10 calculates the internal resistance R based on the output value of the current sensor 4 and the output value of the voltage sensor 5 (step 48). FIG. 7 is a diagram for illustrating the calculation of the internal resistance R. The ECU 10 samples the output value of the current sensor 4 and the output value of the voltage sensor 5 at a predetermined timing while the generator 1 is in operation for generating electric power. The output value of the current sensor 4 and the output value of the voltage sensor 5 at the same sampling time can be expressed as one point of correlation data on a two-dimensional plane as shown in FIG. 7. The line Lr as shown in FIG. 7 is drawn to be applied to plural correlation data points plotted in FIG. 7 as much as possible, namely, a regression line. Examples of applying include a least-square method or the like. The regression line Lr can be used to express the battery voltage V as the arithmetic expression "V=Vo+I×R" using the battery current I and the internal resistance R. "Vo"

corresponds to the battery voltage when the battery current I is zero. Accordingly, it is possible for the ECU 10 to calculate the internal resistance R based on the arithmetic expression "V=Vo+I×R." The internal resistance R is calculated based on the regression curve Lr in this manner, thereby obtaining the calculation result excellent in accuracy in consideration of variation.

Since the plural correlation data points plotted in FIG. 7 are gathered in the vicinity of a certain constant battery current value if an intermediate fixed failure has occurred in the current sensor 4, the inclination of the regression line Lr as shown in FIG. 7 becomes large to approximate infinity. Accordingly, the internal resistance R corresponds to the inclination of the regression curve Lr, thereby making it possible to determine whether an intermediate fixed failure has occurred in the current sensor 4 based on the size of the internal resistance R calculated as described above. Note that any suitable method other than the above-described one may be used for calculating the internal resistance.

The ECU 10 then determines whether the internal resistance R is smaller than the predetermined threshold value XR (step 50). If the internal resistance R is smaller than the threshold value XR, it is determined that the current sensor 4 is in a normal state because the inclination of the regression curve Lr is small (step 52). If the internal resistance R is not smaller than the threshold value XR, it is determined that an intermediate fixed failure has occurred in the current sensor 4 because the inclination of the regression curve Lr is large (step 54). Note that the sensitivity to determine an intermediate fixed failure in the current sensor 4 is changed depending on the threshold value XR. As the threshold value XR is set to be smaller, it becomes easier to determine the occurrence of an intermediate fixed failure in the current sensor 4. When the flow as shown in FIG. 4 is finished, the process of step 200 of the flow in FIG. 2 is finished.

As described above, the abnormality determination device of the power supply of the present embodiment has no possibility of erroneously determining that an intermediate fixed failure has occurred in the current sensor 4 despite the fact that an open failure has occurred in the battery 2 and makes it possible to discriminate between an open failure in the battery 2 and an intermediate fixed failure in the battery sensor 4.

The preferred embodiments of the present invention are described above, but the present invention is not limited to the above-described embodiments and various modifications and replacements can be added to the above-described embodiments without departing from the scope of the present invention.

For example, the determination of an intermediate fixed failure in the current sensor 4 may be made based on the output value of the battery current I instead of the internal resistance R as shown in FIG. 4. If the sampling data of the output value of the battery current I in any predetermined time falls within a small predetermined range while the generator 1 is in operation for generating electric power, it is equivalent to the large inclination of the regression curve Lr, thereby making it possible to determine that an intermediate fixed failure has occurred in the current sensor 4.

The present application is based on Japanese Priority Application No. 2006-50035, filed on Feb. 27, 2006, the entire contents of which are hereby incorporated by reference.

The invention claimed is:

1. An abnormality determination device of a power supply having a battery that supplies electric power to an electric load, a current sensor that detects a current of the battery, and a voltage sensor that detects a voltage of the battery, the device comprising:

determination means for determining that an open failure has occurred in the battery when the voltage detected by the voltage sensor is larger than a first predetermined change amount and the current detected by the current sensor is smaller than a second predetermined change amount, and for determining that an intermediate fixed failure has occurred in the current sensor when the voltage detected by the voltage sensor is less than or equal to the first change amount and the current detected by the current sensor is smaller than the second change amount.

2. The abnormality determination device of the power supply according to claim 1, wherein the battery is capable of being charged with a generator.

3. An abnormality determination device of a power supply having a battery that supplies electric power to an electric load, a current sensor that detects a current of the battery, and a voltage sensor that detects a voltage of the battery, the device comprising:

determination means for determining that an open failure has occurred in the battery when the voltage detected by the voltage sensor is larger than a first predetermined change amount and the current detected by the current sensor is smaller than a second predetermined change amount, and for determining that an intermediate fixed failure has occurred in the current sensor when the battery is in a normal state and an internal resistance of the battery is greater than or equal to a predetermined value.

4. The abnormality determination device of the power supply according to claim 3, wherein the internal resistance is calculated based on a regression curve obtained by using the current and the voltage of the battery.

5. The abnormality determination device of the power supply according to claim 3, wherein the battery is capable of being charged with a generator.

6. An abnormality determination method of a power supply having a battery that supplies electric power to an electric load, a current sensor that detects a current of the battery, and a voltage sensor that detects a voltage of the battery, the method comprising:

determining that an open failure has occurred in the battery when the voltage detected by the voltage sensor is larger than a first predetermined change amount and the current detected by the current sensor is smaller than a second predetermined change amount; and determining, if the open failure is not found in the battery, that an intermediate fixed failure has occurred in the current sensor when an internal resistance of the battery is greater than or equal to a predetermined value.

7. The abnormality determination method of the power supply according to claim 6, comprising:

calculating the internal resistance based on a regression curve obtained by using the current and the voltage of the battery.

8. The abnormality determination method of the power supply according to claim 6, wherein the battery is capable of being charged with a generator.

* * * * *